United States Patent
Yuan et al.

(10) Patent No.: US 9,947,757 B2
(45) Date of Patent: Apr. 17, 2018

(54) DISPLAY DEVICE, ARRAY SUBSTRATE, AND THIN FILM TRANSISTOR

(71) Applicant: BOE TECHNOLOGY GROUP CO., LTD., Beijing (CN)

(72) Inventors: Guangcai Yuan, Beijing (CN); Woobong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/075,579

(22) Filed: Mar. 21, 2016

(65) Prior Publication Data

US 2016/0204216 A1 Jul. 14, 2016

Related U.S. Application Data

(63) Continuation of application No. 13/630,104, filed on Sep. 28, 2012, now abandoned.

(30) Foreign Application Priority Data

Apr. 28, 2012 (CN) .......................... 2012 1 0134094
May 8, 2012 (CN) .......................... 2012 1 0141511

(51) Int. Cl.
*H01L 29/423* (2006.01)
*H01L 29/40* (2006.01)
(Continued)

(52) U.S. Cl.
CPC ...... *H01L 29/42384* (2013.01); *H01L 29/401* (2013.01); *H01L 29/4908* (2013.01);
(Continued)

(58) Field of Classification Search
CPC .............. H01L 29/7869; H01L 29/401; H01L 29/4908; H01L 29/66969;
(Continued)

(56) References Cited

U.S. PATENT DOCUMENTS 5,966,594 A 10/1999 Adachi et al.
6,210,997 B1 4/2001 Adachi et al.
(Continued)

FOREIGN PATENT DOCUMENTS

CN 1489189 A 4/2004
CN 1622296 A 6/2005
(Continued)

OTHER PUBLICATIONS

Japanese Office Action dated Aug. 29, 2016; Appl. No. 2012-227751.
(Continued)

*Primary Examiner* — Cheung Lee
*Assistant Examiner* — Stephen C Smith
(74) *Attorney, Agent, or Firm* — Ladas & Parry LLP

(57) ABSTRACT

A method for manufacturing the thin film transistor, including: forming a gate, an active layer and a gate insulating layer disposed between the gate and the active layer; wherein the gate insulating layer is in a double-layer structure comprising a first gate insulating layer next to the gate and a second gate insulating layer next to the active layer, and one of the first gate insulating layer and the second gate insulating layer is annealed.

9 Claims, 12 Drawing Sheets

(51) Int. Cl.
*H01L 29/66* (2006.01)
*H01L 29/786* (2006.01)
*H01L 29/49* (2006.01)

(52) U.S. Cl.
CPC .... *H01L 29/66969* (2013.01); *H01L 29/7869* (2013.01); *H01L 2029/42388* (2013.01)

(58) Field of Classification Search
CPC ..... H01L 2029/42388; H01L 29/42384; H01L 21/02296; H01L 21/28185; H01L 21/324
See application file for complete search history.

(56) References Cited

U.S. PATENT DOCUMENTS

| | | | |
|---|---|---|---|
| 7,187,594 | B2 | 3/2007 | Shibata et al. |
| 8,264,144 | B2 | 9/2012 | Oikawa et al. |
| 8,288,766 | B2 * | 10/2012 | Lee .................... H01L 27/1225 257/43 |
| 8,421,068 | B2 | 4/2013 | Yamazaki et al. |
| 2003/0047785 | A1 | 3/2003 | Kawasaki et al. |
| 2004/0043547 | A1 | 3/2004 | Lee |
| 2006/0244107 | A1 | 11/2006 | Sugihara et al. |
| 2007/0045627 | A1 | 3/2007 | Park et al. |
| 2008/0038884 | A1 | 2/2008 | Hwang |
| 2010/0025676 | A1 * | 2/2010 | Yamazaki ........... H01L 29/7869 257/43 |
| 2010/0025680 | A1 | 2/2010 | Shino et al. |
| 2010/0065841 | A1 | 3/2010 | Lee et al. |
| 2010/0193784 | A1 | 8/2010 | Morosawa et al. |
| 2010/0283049 | A1 | 11/2010 | Sato et al. |
| 2011/0003430 | A1 | 1/2011 | Yamazaki et al. |
| 2011/0117697 | A1 * | 5/2011 | Akimoto ............. H01L 27/1225 438/104 |
| 2011/0127518 | A1 | 6/2011 | Jung et al. |
| 2011/0140116 | A1 | 6/2011 | Morosawa et al. |
| 2011/0220897 | A1 | 9/2011 | Shin |
| 2011/0315983 | A1 | 12/2011 | Jeong et al. |
| 2011/0318851 | A1 | 12/2011 | Godo et al. |
| 2012/0062813 | A1 | 3/2012 | Koyama |
| 2012/0175608 | A1 | 7/2012 | Yamazaki |
| 2013/0234135 | A1 | 9/2013 | Mochizuki et al. |
| 2013/0248855 | A1 | 9/2013 | Miki et al. |

FOREIGN PATENT DOCUMENTS

| | | |
|---|---|---|
| CN | 1913163 A | 2/2007 |
| CN | 101123223 A | 2/2008 |
| CN | 101640220 A | 2/2010 |
| CN | 102194742 A | 9/2011 |
| CN | 202549848 U | 11/2012 |
| JP | 10-125921 A | 5/1998 |
| JP | 2005-033172 A | 2/2005 |
| JP | 2007-123861 A | 5/2007 |
| JP | 2008-060419 A | 3/2008 |
| JP | 2011-029629 A | 2/2011 |
| JP | 2012-078823 A | 4/2012 |
| KR | 20120000504 A | 1/2012 |

OTHER PUBLICATIONS

Extended European Search Report dated Mar. 28, 2013; Appln. No. 12186634.7-1508.
International Search Report dated Feb. 7, 2013; PCT/CN2012/080432.
International Preliminary Report on Patentability dated Oct. 28, 2014; PCT/CN2012/080432.
EPO Communication dated Feb. 3, 2015; Appln. No. 12 186 634.7-1504.
EPO Office Action dated Dec. 21, 2015; Appln. No. 12186634.7-1504 / 2657973.
First Chinese Office Action dated Apr. 1, 2013; Appln. No. 201210141511.6.
First Korean Office Action dated Aug. 21, 2013; Appln. No. 10-2012-0116455.
Second Korean Office Action dated Feb. 21, 2014; Appln. No. 10-2012-0116455.
Korean Non-Final Office Action dated Aug. 26, 2014; Appln. No. 10-2012-0116455.
Korean Office Action dated Dec. 24, 2014; Appln. No. 10-2012-0116455.
Korean Office Action dated Feb. 24, 2015; Appln. No. 10-2012-0116455.
USPTO NFOA dated Oct. 25, 2013 in connection with U.S. Appl. No. 13/630,104.
USPTO FOA dated Mar. 7, 2014 in connection with U.S. Appl. No. 13/630,104.
USPTO NFOA dated Jul. 31, 2014 in connection with U.S. Appl. 13/630,104.
USPTO FOA dated Dec. 19, 2014 in connection with U.S. Appl. No. 13/630,104.
USPTO NFOA dated Jun. 29, 2015 in connection with U.S. Appl. No. 13/630,104.
USPTO FOA dated Dec. 21, 2015 in connection with U.S. Appl. No. 13/630,104.
USPTO Advisory Action dated Mar. 11, 2016 in connection with U.S. Appl. No. 13/630,104.
Japanese Office Action dated Apr. 25, 2016; Appln. No. 2012-227751.

* cited by examiner

DISPLAY DEVICE, ARRAY SUBSTRATE, AND THIN FILM TRANSISTOR

TECHNICAL FIELD

Embodiments of the present invention relate to a display device, an array substrate, a thin film transistor and a method for manufacturing the same.

BACKGROUND

Oxide thin film transistors (TFTs) have such advantages as thin profile, light weight, low power consumption, etc. They can be used not only for manufacture of liquid crystal display panels but also for an organic light-emitting diode (OLED) display panels.

Referring to FIG. 1 and FIGS. 2A to 2E, a method for manufacturing an oxide TFT array substrate in prior art will be described.

FIG. 1 is a flow chart illustrating the method for manufacturing the oxide TFT array substrate in prior art, and FIGS. 2A to 2F are cross-sectional views during the course of manufacturing the oxide TFT array substrate.

Step S101': a gate layer is formed on a substrate.

As shown in FIG. 2A, a gate layer 13 is formed on a glass substrate 12. During manufacture of TFTs, the gates are mostly manufactured by means of magnetron sputtering, and the electrode material can be selected depending on different device structures and process requirements. Metals usually used for the gates include Mo, Mo—Al—Mo alloy, stack structure of Mo/Al—Nd/Mo for electrodes, Cu, Cu alloy and metal Ti, and any alloys of the above metals, etc.

Step S102': the gate layer is patterned.

As shown in FIG. 2B, by means of wet etching, the gate metal layer 13 is patterned so as to obtain a gate 13a, a gate line (not shown), and a common electrode line 13b. The common electrode line may not be formed depending on a specific design.

Step S103': a gate insulating layer is formed on the gate.

As shown in FIG. 2C, after patterning for the gate, a pre-clean process before film formation is performed, and then by means of plasma enhanced chemical vapor deposition (PECVD), a gate insulating layer 14 is produced on the substrate with the gate pattern. The material for the gate insulating layer 14 can be selected from, such as, a silicon dioxide ($SiO_2$) thin film, a silicon nitride ($SiN_x$) thin film, a silicon oxynitride thin film ($SiO_xN_y$), an aluminum oxide ($Al_2O_3$) thin film, and a titanium oxide ($TiO_x$) thin film or a composite thin film with a multilayer structure.

Step S104': a surface treatment is performed on the gate insulating layer.

During manufacture of a thin film transistor (TFT), especially for an oxide thin film transistor, characteristics of the surface of the gate insulating layer have a greatly important effect on characteristics of the entire TFT. Plasma is usually used to carry out surface treatment or surface modification.

Step S105': an oxide semiconductor for an active layer is formed.

As shown in FIG. 2D, an oxide semiconductor layer 15 for an active layer is formed. The critical stage for manufacturing the oxide TFT is to form the oxide semiconductor for the active layer. The widely used oxide semiconductors at present include indium gallium zinc oxide (IGZO), indium gallium tin oxide (IGTO), indium zinc oxide (IZO) and so on, and compositions of different proportions related to them. The main manufacturing methods comprise a magnetron sputtering deposition and a solution method, etc.

Step S106': the oxide semiconductor for the active layer is patterned.

As shown in FIG. 2E, the oxide semiconductor for the active layer is patterned 15a. For the patterning process of the oxide semiconductor for the active layer, there are two main etching processes: a wet etching and a dry etching. Different used methods will cause different damages to the oxide semiconductor layer. Selection of a suitable patterning process is an important way to improve characteristics of the oxide TFT.

Step S107': a thin film for an etch stop layer is formed and patterned.

As shown in FIG. 2F, an etch stop layer (ESL) 16 is formed. In view of respective different process requirements addressed by different producers, the material for the etch stop layer is different. Generally, an inorganic insulating material, such as $SiO_x$, $SiN_x$, $SiO_xN_y$, $Al_2O_3$, $TiO_x$ or the like, may be used so as to reduce the damages to the oxide semiconductor thin film occurring in the course of patterning a data line. After formation of the thin film for the etch stop layer, a patterning process is carried out. The ESL is usually patterned by means of dry etching so as to form an etch stop layer 16a, as shown in FIG. 2G.

Step S108': a source, a drain, a data line and a power supply line are formed.

As shown in FIG. 2H, after patterning of the ESL, a source, a drain, a data line and a power supply line are formed. Firstly, a metal layer 17 is deposited, and then patterned by means of wet etching, so as to form the source, the drain 17a, the data line and the power supply line (not shown), as shown in FIG. 2I.

Step S109': via holes are formed by etching.

As shown in FIG. 2J, after patterning of the data line and the power supply line, a passivation layer 18 is formed on the whole plane, and generally, an inorganic insulation material, such as, $SiO_x$, $SiN_x$, $SiO_xN_y$, $Al_2O_3$, $TiO_x$ or the like, may be used. After formation of the passivation layer, a via-hole etching process is carried out to form via holes 19a and 19b so as to achieve each wiring and connection to a pixel electrode, as shown in FIG. 2K.

Step S110': a pixel electrode is formed by depositing and patterning.

As shown in FIG. 2L, after formation of the via holes, a pixel electrode layer 20 is formed. An indium tin oxide (ITO) is now widely used as the material for the pixel electrode layer 20, and it is patterned by means of wet etching to form a pixel electrode 20a and a contact electrode 20b, as shown in FIG. 2M.

During the above manufacturing process of the array substrate, doping of groups including hydrogen, such as, OH—, H+ and absorbed hydrogen element, etc., cannot be avoided within the gate insulating layer in the process of manufacturing the gate insulating layer. These groups are easily broken during manufacture of the device and in an operating state of the device, and subsequently diffused to the interface between the gate insulating layer and the oxide semiconductor layer. As the time goes by and the environment changes, the groups are very likely further diffused into the oxide semiconductor. The diffused substances of OH—, $H_2O$, H+ and the like will bring an adverse effect on stability of the device, so that a relatively large drift may happen to a threshold voltage Vth of an oxide thin film transistor device, which causes malfunction of the product.

SUMMARY

One of technical problems aimed to be solved by the embodiments of the present invention relate to the defect that, in an existing array substrate, hydrogen groups doped within a gate insulating layer tend to degrade the stability of the device, resulting in adverse effect on the yield of the products.

For solve the above problem, according to an aspect of the invention, there is provided a thin film transistor, comprising a gate, an active layer and a gate insulating layer disposed between the gate and the active layer, the active layer being an oxide semiconductor, and the gate insulating layer comprising at least one layer of inorganic insulating thin film.

In an example, the gate insulating layer is a single layer which is a first gate insulating layer, that is, the gate insulating layer is in one-layer structure.

For example, the first gate insulating layer is a silicon dioxide thin film, a silicon nitride thin film, a silicon oxynitride thin film, an aluminum oxide thin film or a titanium oxide thin film.

For example, the first gate insulating layer is an insulating layer subjected to an annealing process.

For example, the first gate insulating layer has a thickness of 50 nm~500 nm.

For example, the first gate insulating layer has a thickness of 100 nm~300 nm.

In another example, the gate insulating layer is in a double-layer structure comprising a first gate insulating layer next to the gate and a second gate insulating layer next to the active layer, wherein at least one of the first gate insulating layer and the second gate insulating layer is an inorganic insulating thin film.

For example, each of the first gate insulating layer and the second gate insulating layer is an inorganic insulating thin film.

For example, the first gate insulating layer is a silicon nitride thin film or a silicon oxynitride thin film.

For example, the second gate insulating layer is a silicon oxide thin film, a yttrium oxide thin film or a silicon oxynitride thin film.

For example, the first gate insulating layer is an insulating layer subjected to an annealing process.

For example, the second gate insulating layer is an insulating layer subjected to an annealing process.

For example, the first gate insulating layer has a thickness of 50 nm~600 nm. For example, the first gate insulating layer has a thickness of 100 nm~300 nm.

For example, the second gate insulating layer has a thickness of 50 nm~650 nm. For example, the second gate insulating layer has a thickness of 100 nm~200 nm.

In still another example, the gate insulating layer is in a three-layer structure comprising a first gate insulating layer next to the gate, a second gate insulating layer, and a third gate insulating layer next to the active layer, the second gate insulating layer is located between the first gate insulating layer and the third gate insulating layer, wherein at least one of the first gate insulating layer, the second gate insulating layer and the third gate insulating layer is an inorganic insulating thin film.

For example, each of the first gate insulating layer, the second gate insulating layer and the third gate insulating layer is an inorganic insulating thin film.

For example, the first gate insulating layer is a silicon nitride thin film, a silicon oxynitride thin film or other inorganic insulating thin film.

For example, the second gate insulating layer is a silicon oxynitride thin film or other inorganic insulating thin film.

For example, the third gate insulating layer is a silicon oxide thin film, an aluminum oxide thin film, a titanium oxide thin film, or other inorganic insulating thin film.

For example, the first gate insulating layer has a thickness of 50 nm~600 nm; and for example, the first gate insulating layer has a thickness of 100 nm~200 nm.

For example, the second gate insulating layer has a thickness of 50 nm~650 nm; and for example, the second gate insulating layer has a thickness of 100 nm~200 nm.

For example, the third gate insulating layer has a thickness of 20 nm~600 nm; and for example, the third gate insulating layer has a thickness of 100 nm~150 nm.

For example, the gate is formed of Cu or Cu alloy.

According to another aspect of the invention, there is further provided a method for manufacturing a thin film transistor, comprising:

a step of manufacturing a gate insulating layer, the gate insulating layer comprising at least one layer of inorganic insulating thin film.

In an example, the gate insulating layer is a single layer which is a first gate insulating layer. The method for manufacturing the gate insulating layer comprises: S11: forming the first gate insulating layer with an inorganic insulating material; and step S12: performing an annealing process on the first gate insulating layer.

For example, the first gate insulating layer is formed of silicon dioxide, silicon nitride, silicon oxynitride, aluminum oxide or titanium oxide.

For example, the first gate insulating layer has a thickness of 50 nm~500 nm; and for example, the first gate insulating layer has a thickness of 100 nm~300 nm.

In another example, the gate insulating layer is in a double-layer structure comprising a first gate insulating layer next to the gate and a second gate insulating layer next to the active layer.

The method for manufacturing the gate insulating layer comprises the following steps: step S21: forming the first gate insulating layer; step S22: performing an annealing process on the first gate insulating layer; step S23: forming the second gate insulating layer. The method for manufacturing the gate insulating layer is used for manufacture of a bottom-gate type thin film transistor.

Alternatively, the method for manufacturing the gate insulating layer comprises the following steps: step S21: forming the second gate insulating layer; step S22: forming the first gate insulating layer; step S23: performing an annealing process on the first gate insulating layer. The method for manufacturing the gate insulating layer is used for manufacture of a top-gate type thin film transistor.

For example, at least one of the first gate insulating layer and the second gate insulating layer is an inorganic insulating thin film.

For example, the first gate insulating layer is formed of silicon nitride, silicon oxynitride or other inorganic insulating material.

For example, the second gate insulating layer is formed of silicon oxide, yttrium oxide, silicon oxynitride or other inorganic insulating material.

For example, the first gate insulating layer has a thickness of 50 nm~600 nm. For example, the first gate insulating layer has a thickness of 100 nm~300 nm.

For example, the second gate insulating layer has a thickness of 50 nm~650 nm. For example, the second gate insulating layer has a thickness of 100 nm~200 nm.

In yet still another example, the gate insulating layer is in a three-layer structure comprising a first gate insulating layer next to the gate, a second gate insulating layer, and a third gate insulating layer next to the active layer, the second gate insulating layer is located between the first gate insulating layer and the third gate insulating layer.

The method for manufacturing the gate insulating layer comprises the following steps: step S31: forming the first gate insulating layer; step S32: forming the second gate insulating layer; and step S33: forming the third gate insulating layer. The method for manufacturing the gate insulating layer is used for manufacture of a bottom-gate type thin film transistor.

Alternatively, the method for manufacturing the gate insulating layer comprises the following steps: step S31: forming the third gate insulating layer; step S32: forming the second gate insulating layer; and step S33: forming the first gate insulating layer. The method for manufacturing the gate insulating layer is used for manufacture of a top-gate type thin film transistor.

For example, the first gate insulating layer is an inorganic insulating thin film, and/or, the second gate insulating layer is an inorganic insulating thin film, and/or, the third gate insulating layer is an inorganic insulating thin film.

For example, the first gate insulating layer is formed of silicon nitride, silicon oxynitride or other inorganic insulating material.

For example, the second gate insulating layer is formed of silicon oxynitride or other inorganic insulating material.

For example, the third gate insulating layer is formed of silicon oxide, aluminum oxide, titanium oxide, or other inorganic insulating material.

For example, the first gate insulating layer has a thickness of 50 nm~600 nm. For example, the first gate insulating layer has a thickness of 100 nm~200 nm.

For example, the second gate insulating layer has a thickness of 50 nm~650 nm. For example, the second gate insulating layer has a thickness of 100 nm~200 nm.

For example, the third gate insulating layer has a thickness of 20 nm~600 nm. For example, the third gate insulating layer has a thickness of 100 nm~150 nm.

For example, the annealing process comprises: the first gate insulating layer being dehydrogenized with a high temperature annealing furnace, the annealing being carried out under the protection of nitrogen gas, vacuum, or rare gas, in which an annealing temperature is 250° C.~450° C., and an annealing time period is 20 min~150 min.

For example, the annealing process comprises: a vacuum heating chamber being incorporated into a PECVD apparatus, in which the pressure is 104 Pa~1 Pa, and a dehydrogenizing process being performed on the first gate insulating layer, in which the temperature of the annealing chamber is 350° C.~480° C., and an annealing time period is 10 min~30 min.

According to still another aspect, there is provided an array substrate, comprising any of the above thin film transistors.

According to yet still another aspect, there is provided a display device, comprising the above array substrate.

BRIEF DESCRIPTION OF THE DRAWINGS

In order to clearly illustrate the technical solution of the embodiments of the invention, the drawings of the embodiments will be briefly described in the following; and it is obvious that the described drawings below are only related to some embodiments of the invention and thus are not limitative of the invention.

DETAILED DESCRIPTION

In order to make objects, technical details and advantages of the embodiments of the invention apparent, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
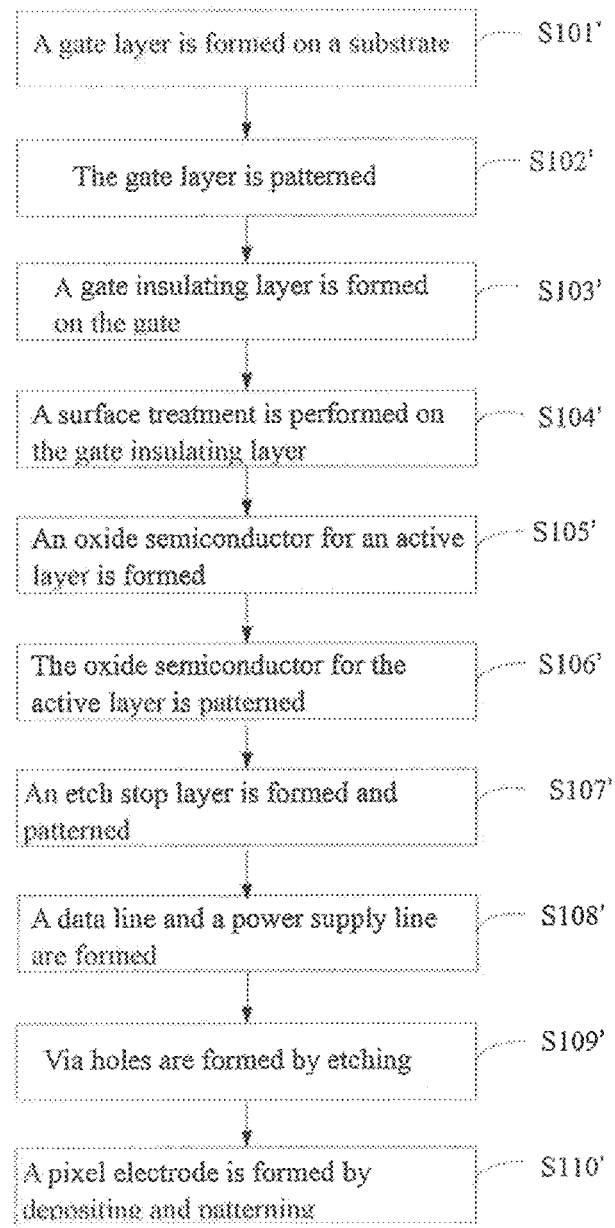
FIG. 1 is a flow chart showing a method for manufacturing an oxide TFT array substrate in prior art.
Figure 2A:
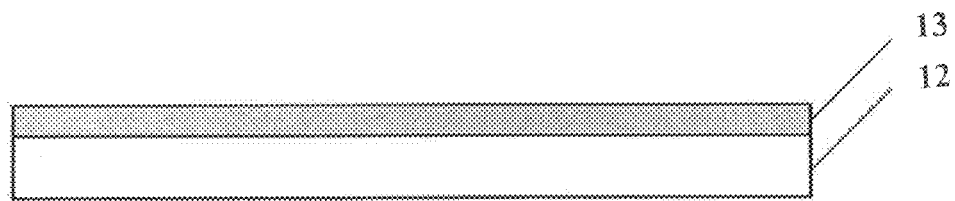
FIGS. 2A to 2M are the first to thirteenth schematic views showing the manufacture of the oxide TFT array substrate in prior art, respectively.
Figure 2B:
Figure 2C:
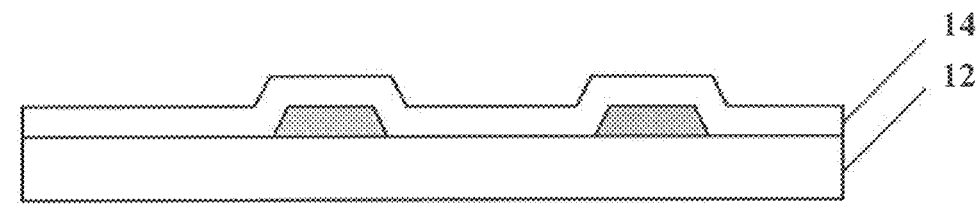
Figure 2D:
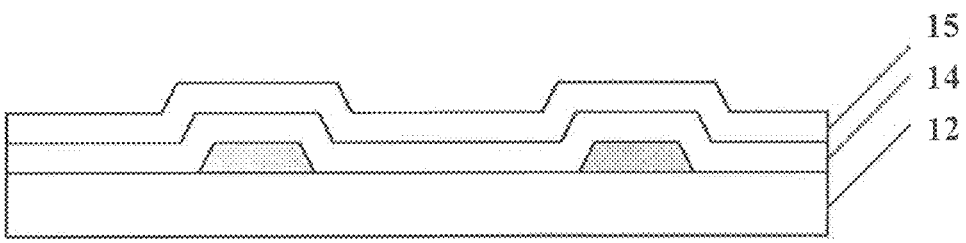
Figure 2E:
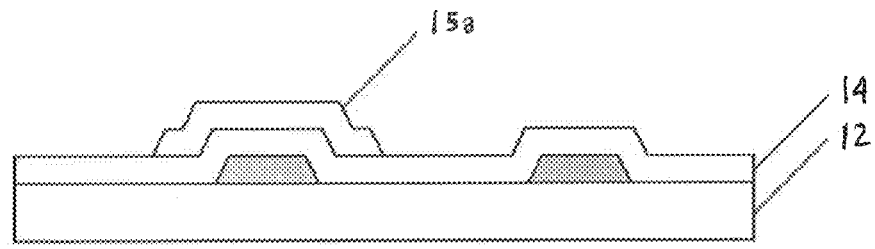
Figure 2F:
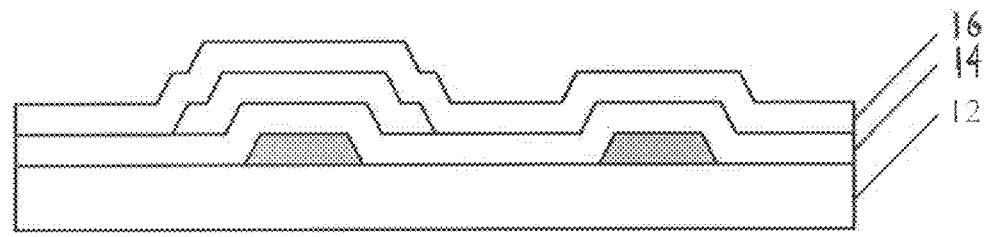
Figure 2G:
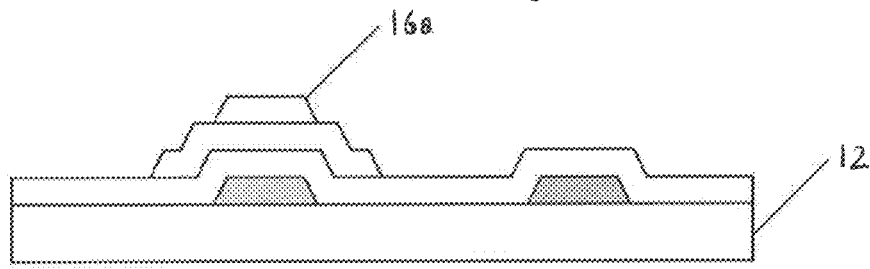
Figure 2H:
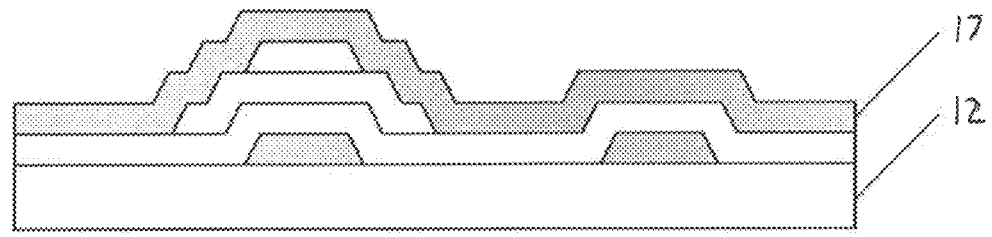
Figure 2I:
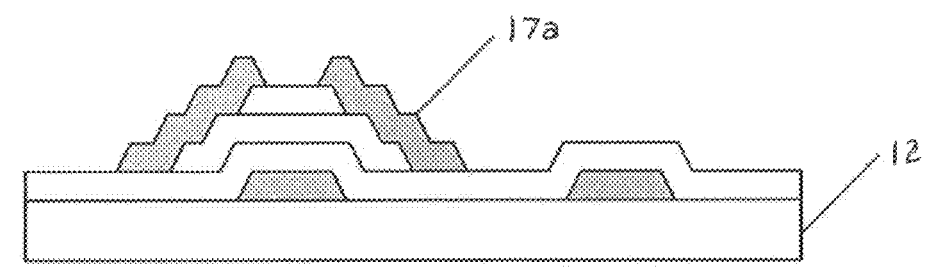
Figure 2J:
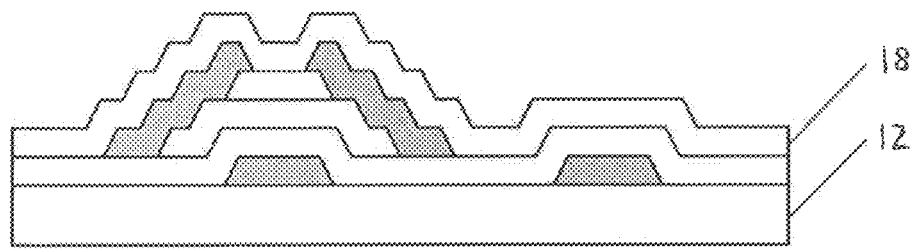
Figure 2K:
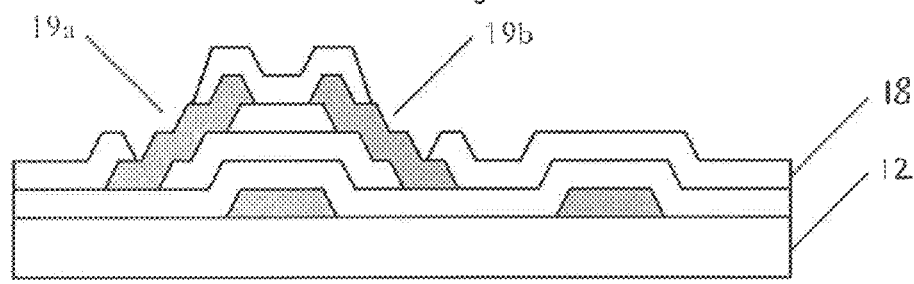
Figure 2L:
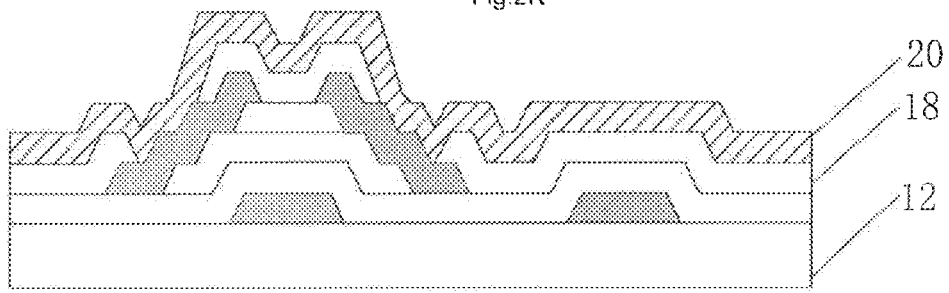
Figure 2M:
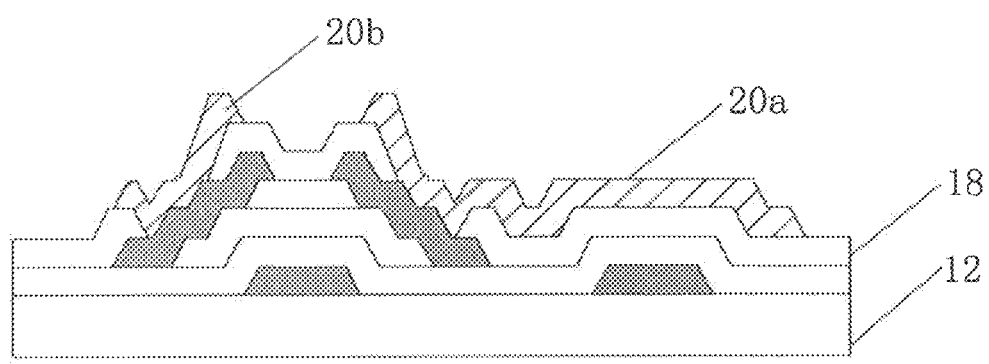
Figure 3:
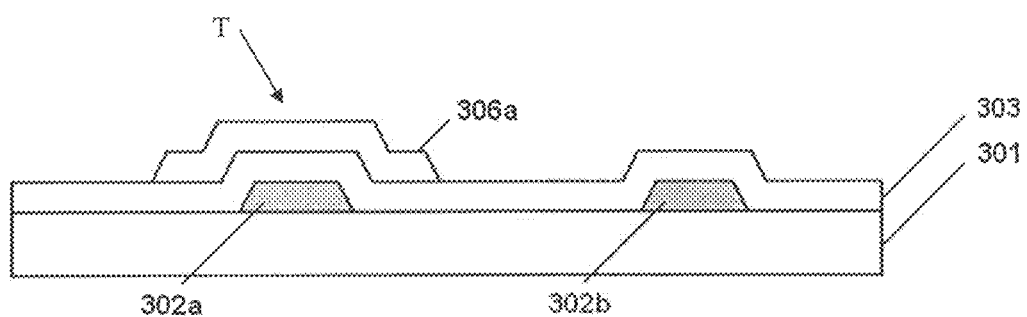
FIG. 3 is a structurally schematic view showing a thin film transistor according to a first embodiment of the invention.

As shown in FIG. 3, a thin film transistor provided by the first embodiment has a thin film transistor structure with a gate layer at the bottom layer (i.e., a bottom-gate type). The thin film transistor T comprises: a gate 302a located on a substrate 301, and a gate insulating layer and an active layer 306a which are provided on the gate 302a. The active layer 306a is an oxide semiconductor, the gate 302a is Cu or Cu alloy; the gate insulating layer has a single layer structure comprising a first gate insulating layer 303, and the first gate insulating layer 303 may be a silicon dioxide thin film, a silicon nitride thin film, a silicon oxynitride thin film, an aluminum oxide thin film, or a titanium oxide thin film. The thickness of the first gate insulating layer 303 is 50 nm~500 nm.

In the present embodiment of the invention, for the first gate insulating layer 303, the silicon dioxide thin film, the silicon nitride thin film, the silicon oxynitride thin film, the aluminum oxide thin film, or the titanium oxide thin film can be used, and a thin film formed of another inorganic insulating material possessing the same or similar material characteristics as the above-mentioned substance may be used as well.

When the thickness of the first gate insulating layer 303 is 50 nm~500 nm, it can be assured that manufacture of the first gate insulating layer is completed in a short time period while the adverse effect on the oxide semiconductor given by hydrogen-containing groups can be effectively avoided. That is, the production efficiency is guaranteed. If the thickness of the first gate insulating layer is too thin, it cannot function to avoid the hydrogen-containing group from affecting the oxide semiconductor; and if the first gate insulating layer is too thick, a longer tact time period is needed, which causes reduction of the production efficiency.

More preferably, the thickness of the first gate insulating layer is 100 nm~300 nm, and in this case, the relationship between avoidance of the effect on the oxide semiconductor given by the hydrogen-containing groups and a suitable tact time period can be better balanced. That is, it is possible that a shortest tact time period is used and the production efficiency is enhanced and at the same time the effect on the oxide semiconductor given by the hydrogen-containing groups can be effectively avoided.

To guarantee better characteristics of the device, in the present embodiment, an annealing process can be performed on the first gate insulating layer (i.e. the first gate insulating layer is an insulating layer subjected to the annealing process), so as to reduce the effect on characteristics of the oxide semiconductor given by hydrogen elements and complexes of hydrogen within the gate insulating layer.

It should be noted that showing in FIG. 3 is a part of an array substrate comprising the thin film transistor according to the embodiment, and the thin film transistor provided by the embodiment of the invention is in the portion on the left side of FIG. 3; the reference number 302b refers to a common electrode line of the array substrate, which, for example, is formed in the same patterning process with the same metal layer as the gate 302a. When the thin film transistor according to the embodiment of the invention is used for manufacturing an array substrate, the common electrode line 302b may not be formed as well, or may be formed but not with the same metal layer as the gate simultaneously.

The source and drain of the thin film transistor according to the embodiment are not shown in FIG. 3, but they should be formed over the active layer 306a, spaced from each other by a distance and opposite to each other, and the part of the active layer 306a located between the source and the drain constitutes a channel. The oxide semiconductor of the active layer 306a may comprise indium gallium zinc oxide (IGZO), indium gallium tin oxide (IGTO), indium zinc oxide (IZO) and so on, or compositions of different proportions of the materials.

Figure 4:
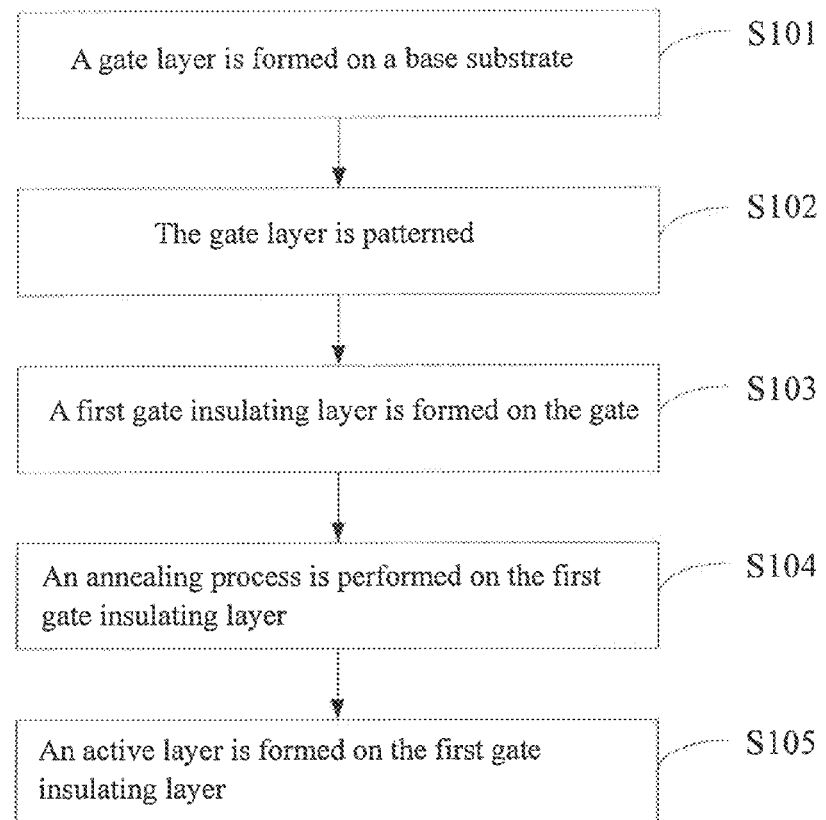
FIG. 4 is a flow chart showing a method for manufacturing the thin film transistor according to the first embodiment of the invention.

According to the embodiment, there is further provided a method for manufacturing the thin film transistor having the above structure. As shown in FIG. 4, the method comprises the following steps.

Step S101: a gate layer is formed on a base substrate.

For example, a gate layer is formed on a glass substrate, which is an example of the base substrate. The gate layer is usually produced by means of magnetron sputtering, and the conductive material for the electrode may include copper and an alloy thereof, the thickness is generally 200 nm-350 nm, and the sheet resistance of it is kept at a relatively low level.

Step S102: the gate layer is patterned.

For example, by means of wet etching, the gate layer is patterned to form a gate.

Step S103: a first gate insulating layer is formed on the gate.

In the embodiment, the gate insulating layer is a single layer, and a silicon dioxide thin film, silicon nitride, silicon oxynitride, aluminum oxide, titanium oxide or other inorganic insulating material can be used to form the first gate insulating layer. The thickness of the first gate insulating layer is 50 nm~500 nm.

As stated above, when the thickness of the first gate insulating layer is 50 nm~500 nm, manufacture of the first gate insulating layer can be surely completed in a shorter time period, i.e., the production efficiency can guaranteed while the effect on the oxide semiconductor given by hydrogen-containing groups is effectively avoided.

More preferably, the thickness of the first gate insulating layer is 100 nm~300 nm, and in this case, it is possible that a shortest tact time period can be used and the production efficiency is enhanced and at the same time the effect on the oxide semiconductor given by the hydrogen-containing groups is effectively avoided.

Step S104: an annealing process is performed on the first gate insulating layer.

The annealing process can be optimized by using a high temperature annealing furnace to dehydrogenize the first gate insulating layer. For example, the annealing is carried out under the protection of nitrogen gas, vacuum, or rare gas, the annealing temperature is 250° C.~450° C., and the annealing time period is 20 min~150 min.

Alternatively, the annealing process can also be optimized by incorporating a vacuum heating chamber into a PECVD apparatus, the pressure being $10^{-4}$ Pa~1 Pa, and performing a dehydrogenizing process on the first gate insulating layer. For example, the temperature of the annealing chamber is 350° C.~480° C., and the annealing time period is 10 min~30 min.

As the optimized annealing process is performed, it is possible for the annealing process in the embodiment to shorten the process time, increase throughput of the product and meanwhile reduce the investment on the equipment, as compared with a conventional annealing process.

Step S105: an active layer is formed on the first gate insulating layer.

Overall steps of manufacturing the thin film transistor also comprise, after the step S105, a step of forming a source and drain of the thin film transistor and other steps. These steps can be implemented with conventional technical means, and details thereof are omitted here.

In the embodiment, it is possible that the effect on characteristics of the oxide semiconductor, which is given by hydrogen elements and complexes of hydrogen doped within the gate insulating layer, is reduced by selecting a specific material for the gate insulating layer in combination with an optimized annealing process.

Metals for the gate in the embodiment can also be selected from Mo, Mo—Al—Mo alloy, stack structure of Mo/Al—Nd/Mo for electrodes, pure Al and alloy thereof, Mo/Nd/Cu, Ti/Cu and other metals, which are commonly used, besides Cu and alloy thereof. It is should be especially noted that, in the event that Cu or an alloy thereof is used as metal for the gate, if the gate insulating layer includes a non-oxide insulating layer, and then, because the material of the non-oxide insulating layer matches poorly with the material of the oxide semiconductor and meanwhile it contains more hydrogen elements and complexes of hydrogen therein, some negative effects will be produced on characteristics of the oxide semiconductor; and when an oxide insulating material layer is used for the gate insulating layer, although the oxide insulating layer tends to produce some effects on the gate of Cu and alloy thereof, it has a better material match with the oxide semiconductor better.

Second Embodiment

The present embodiment differs from the first embodiment in that: the thin film transistor provided by the embodiment is a thin film transistor with a gate layer on the top layer (i.e. a top-gate type). The thin film transistor comprises: an active layer provided on a base substrate, a gate insulating layer located on the active layer, and a gate located on the gate insulating layer. The structure and manufacturing method of the gate insulating layer as well as the gate, the active layer, a source, a drain and so on can be the same as or similar to those in the first embodiment, and details are omitted here.

Third Embodiment

Figure 5:
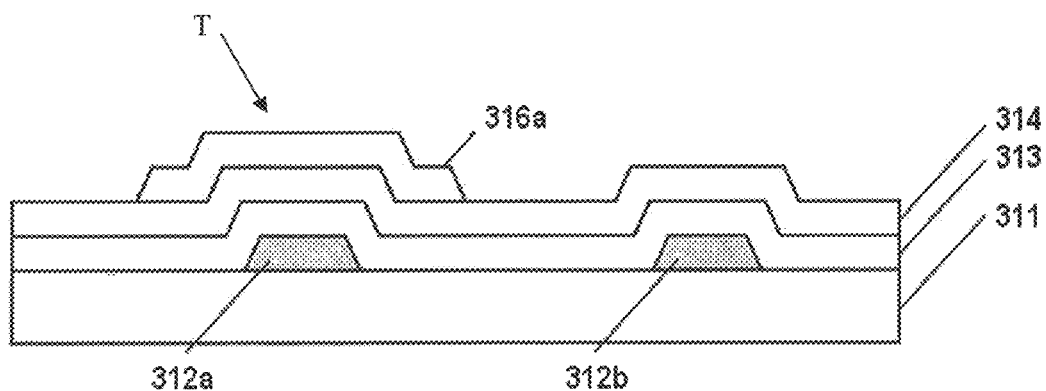
FIG. 5 is a structurally schematic view showing a thin film transistor according to a third embodiment of the invention.

As shown in FIG. 5, the thin film transistor provided by the embodiment has a structure of a thin film transistor with a gate layer at the bottom layer (i.e. a bottom-gate type). The thin film transistor T comprises a gate 312a provided on a base substrate 311, and a gate insulating layer and an active layer 316a, which are provided on the gate 312a. The active layer 316a is an oxide semiconductor, and the gate 312a is Cu or Cu alloy. The gate insulating layer is in a double-layer structure of a first gate insulating layer 313, which is located next to the gate 312a and on the gate, and a second gate insulating layer 314, which is located next to the active layer 316a. The first gate insulating layer 313 is a silicon nitride thin film or a silicon oxynitride thin film, and the second gate insulating layer 314 is silicon oxide, yttrium oxide or silicon oxynitride. For example, the thickness of the first gate insulating layer 313 is 50 nm~600 nm, and the thickness of the second gate insulating layer 314 is 50 nm~650 nm.

In the embodiment, for the first gate insulating layer 313, the silicon nitride thin film or the silicon oxynitride thin film may be used, and a thin film formed of another inorganic insulating material possessing the same or similar material characteristics as the above every substance can be used as well.

In the embodiment, for the second gate insulating layer 314, the silicon oxide thin film, the yttrium oxide thin film or the silicon oxynitride thin film may be used, and a thin film formed of another inorganic insulating material possessing the same or similar material characteristics as the above every substance can be used as well.

In the embodiment, the first gate insulating layer functions to suppress the poor characteristics produced by the gate (especially when Cu or Cu alloy is used). The second gate insulating layer functions to obtain the match with the oxide semiconductor, and reach the effect of enhancing properties of the device.

The material for the second gate insulating layer is an oxide insulating in most cases, which has a poorer diffusion resistant ability with respect to groups such as H+, OH— and so on. Therefore, in an example, after manufacture of the first gate insulating layer is completed, an annealing process is performed on the first gate insulating layer, so as to decrease the groups such as H+, OH— and so on, which might be broken and diffused later, and therefore the stability of the device can be enhanced.

In the embodiment, when the thickness of the first gate insulating layer 313 is for example 50 nm~600 nm, the effect on the oxide semiconductor given by hydrogen-containing groups is effectively avoided (if the layer is too thin, this function can not be achieved), and not too much tact time is sacrificed (if the first gate insulating layer is too thick, a longer tact time period is needed, which causes reduction of the production efficiency).

More preferably, the thickness of the first gate insulating layer 313 is for example 100 nm~300 nm, and in this case, the relationship between avoidance of the effect on the oxide semiconductor given by the hydrogen-containing groups and a suitable tact time period can be better balanced. The above thickness of the first gate insulating layer can greatly suppress the poor characteristics produced by the gate (especially when Cu or Cu alloy is used).

When the thickness of the second gate insulating layer 314 is for example 50 nm~650 nm, a good match with the oxide semiconductor can be obtained, so as to achieve a function of enhancing properties of the device, and it is unnecessary to consume a too much tact time (if the film layer is thicker, a longer tact time period is needed, and the production efficiency is adversely affected).

More preferably, the thickness of the second gate insulating layer 314 is for example 100 nm~200 nm. With this preferable thickness, it is possible that better match between the second gate insulating layer and the oxide semiconductor is obtained, and a tact time period is relatively saved, which thereby enhances the production efficiency.

In the embodiment, in order to further achieve a better technical effect, an annealing process can be performed on the second gate insulating layer.

It should be noted that, what is shown in FIG. 5 is a part of an array substrate comprising the thin film transistor according to the embodiment, and the thin film transistor provided by the embodiment is in the portion on the left side of FIG. 5. In FIG. 5, the reference number 312b refers to a common electrode line of the array substrate, and is formed with the same metal layer as the gate 312a simultaneously. When the thin film transistor according to the embodiment is used to manufacture an array substrate, the common electrode line 312b may not be formed as well, or may be formed but not with the same metal layer as the gate simultaneously.

The source and a drain of the thin film transistor according to the embodiment are not shown in FIG. 5, but they should be formed over the active layer 316a, spaced from each other by a distance and opposite to each other, and the part of the active layer 316a located between the source and the drain constitutes a channel. The oxide semiconductor of the active layer 316a may comprise indium gallium zinc oxide (IGZO), indium gallium tin oxide (IGTO), indium zinc oxide (IZO) and so on, and compositions of different proportions of the materials.

Figure 6:
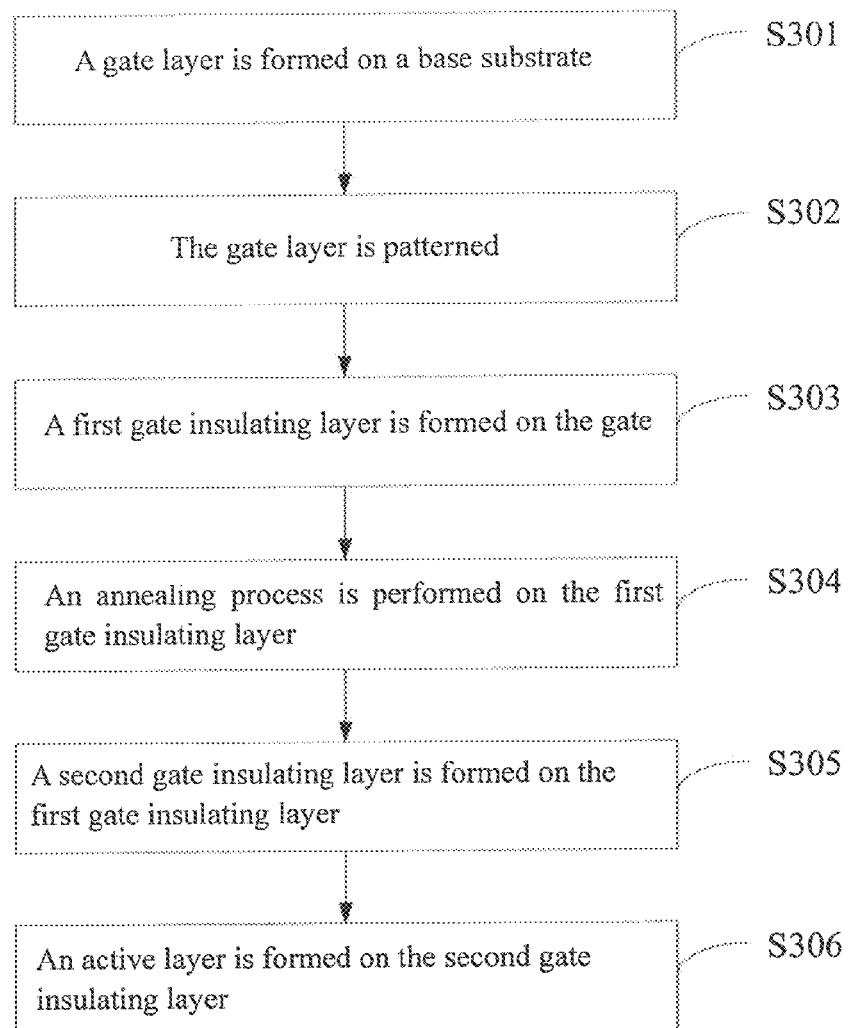
FIG. 6 is a flow chart showing a method for manufacturing the thin film transistor according to the third embodiment of the invention.

According to the embodiment, there is further provided a method for manufacturing the thin film transistor having the above structure. As shown in FIG. 6, the method comprises the following steps.

Step S301: a gate layer is formed on a base substrate.

The gate layer is formed on a glass substrate which is an example of the base substrate. The gate layer is usually produced by means of magnetron sputtering, and material for the electrode may select copper or an alloy thereof, the thickness is generally 200 nm-350 nm, and the sheet resistance of is kept at a relatively low level.

Step S302: the gate layer is patterned.

For example, by means of wet etching, the gate layer is patterned to form a gate.

Step S303: a first gate insulating layer is formed on the gate.

A silicon nitride thin film or a silicon oxynitride thin film is used to form the first gate insulating layer on the gate layer, and the thickness of the first gate insulating layer is for example 50 nm~600 nm.

When the thickness of the first gate insulating layer 313 is 50 nm~600 nm, it is possible that the effect on the oxide semiconductor given by hydrogen-containing groups is effectively avoided, and not too much tact time is sacrificed.

More preferably, the thickness of the first gate insulating layer 313 is set as, e.g., 100 nm~300 nm, and in this case, the relationship between avoidance of the effect on the oxide semiconductor given by the hydrogen-containing groups and a suitable tact time period can be better balanced. Moreover, the above thickness of the first gate insulating layer can greatly suppress the poor characteristics produced by the gate (especially when Cu or Cu alloy is employed).

Step S304: an annealing process is performed on the first gate insulating layer.

For example, the annealing process can be optimized by using a high temperature annealing furnace to dehydrogenize the first gate insulating layer, the annealing is carried out under the protection of nitrogen gas, vacuum, or rare gas, the annealing temperature is 250° C.~450° C., and the annealing time period is 20 min~150 min.

Alternatively, the annealing process can also be optimized by incorporating a vacuum heating chamber into a PECVD apparatus, the pressure being for example $10^{-4}$ Pa~1 Pa, and performing a dehydrogenizing process on the first gate insulating layer; for example, the temperature of the annealing chamber is 350° C.~480° C., and the annealing time period is 10 min~30 min.

The annealing process is performed after the first gate insulating layer is formed, so as to decrease the content of the groups such as H+, OH— and so on in the first gate insulating layer, which might be broken and diffused later. Thus, a function of enhancing stability of the device can be achieved.

The annealing process in the embodiment is an optimized annealing process, and as compared with a conventional annealing process, it is possible that process time is shortened, throughput of the product is increased, and meanwhile investment on the equipment is reduced.

Step S305: silicon oxide, yttrium oxide or silicon oxynitride is used to form a second gate insulating layer on the first gate insulating layer.

The thickness of the second gate insulating layer is, e.g., 50 nm~650 nm.

In this step, in order to further achieve a better technical effect, an annealing process can be performed on the second gate insulating layer. Certainly, the annealing process will increase process time, and the production efficiency is reduced. Thus, whether the annealing process is performed on the second gate insulating layer or not can be made depending on practical requirements.

Step S306: an oxide semiconductor for an active layer is formed on the second gate insulating layer and then patterned.

It can be appreciated by those skilled in the art that, overall steps of manufacturing the thin film transistor also comprise a step of forming a source and a drain of the thin film transistor and other steps following the step S306. These steps each may be achieved by conventional technical means and are not inventive points of the embodiment of the invention, details thereof being omitted here.

The patterning methods of the oxide semiconductor for the active layer comprise wet etching and dry etching. For example, the wet etching can be used to control an etch accuracy nicely.

Fourth Embodiment

The difference between the present embodiment and the third embodiment lies in that: the thin film transistor of the embodiment is a thin film transistor with a gate layer on the top layer (i.e., a top-gate type). The thin film transistor comprises: an active layer located on a base substrate, a gate insulating layer located above the active layer, and a gate located on the gate insulating layer. The structure and manufacturing method of the gate insulating layer may be the same as those of the gate insulating layer in the third embodiment in terms of details thereof. However, because the first gate insulating layer is located next to the gate and the second gate insulating layer is located next to the active layer, it is necessary that the second gate insulating layer be formed first and then the first gate insulating layer be formed in the event that the active layer is at the bottom layer. In an example, an annealing process is performed on the first gate insulating layer. After the annealing process is completed, a gate layer is then formed on the first gate insulating layer. The process method for forming each structural layer may be the same as that of the third embodiment, and therefore details thereof are omitted here.

Fifth Embodiment

Figure 7:
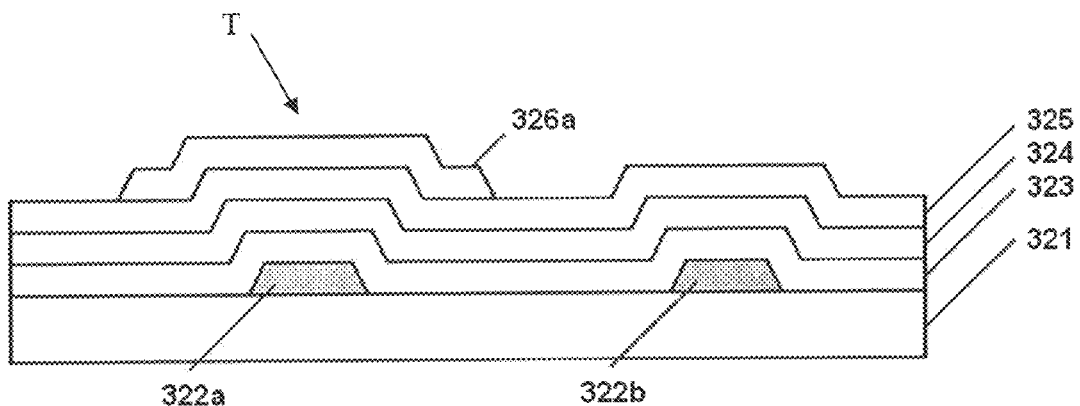
FIG. 7 is a structurally schematic view showing a thin film transistor according to a fifth embodiment of the invention.
Figure 8:
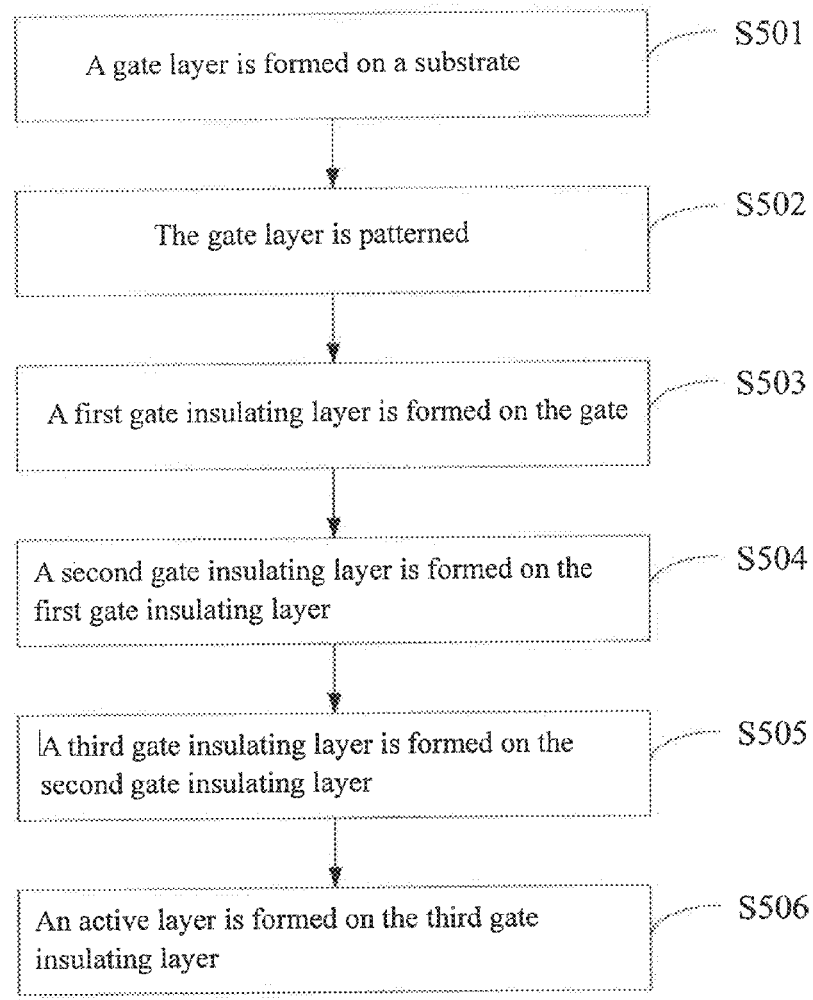
FIG. 8 is a flow chart showing a method for manufacturing the thin film transistor according to the fifth embodiment of the invention.

As shown in FIG. 7, the thin film transistor provided by the embodiment has a structure of a thin film transistor with a gate layer at the bottom layer (i.e. a bottom-gate type). The thin film transistor T comprises a gate 322a provided on a base substrate 321, and a gate insulating layer and an active layer 326a which are provided on the gate. The active layer 326a is an oxide semiconductor, and the gate 322a is Cu or Cu alloy. The gate insulating layer in the embodiment is in a three-layer structure comprising a first gate insulating layer 323, which is located next to the gate, a second gate insulating layer 324, and a third gate insulating layer 325 next to the active layer, the second gate insulating layer 324 being located between the first gate insulating layer 323 and the third gate insulating layer 325. The first gate insulating layer 323 is a silicon nitride thin film or a silicon oxynitride thin film; the second gate insulating layer 324 is a silicon oxynitride thin film; and the third gate insulating layer 325 is silicon oxide, aluminum oxide or titanium oxide.

The thickness of the first gate insulating layer 323 is, e.g., 50 nm~600 nm; the thickness of the second gate insulating layer 324 is, e.g., 50 nm~650 nm; and the thickness of the third gate insulating layer 325 is, e.g., 20 nm~600 nm.

In the present embodiment, the material for the gate 322a may be Cu or Cu alloy, and may also be selected from Mo, Mo—Al—Mo alloy, stack structure of Mo/Al—Nd/Mo for electrodes, pure Al and alloy thereof, Mo/Nd/Cu, Ti/Cu and the like. Of course, use of Cu or Cu alloy as the gate has functions of optimizing the patterning process, enhancing properties of the device, reducing the cost, etc.

In the embodiment, as for the first gate insulating layer 323, the silicon nitride thin film or the silicon oxynitride thin film may be used, and a thin film formed of another inorganic insulating material possessing the same or similar material characteristics as the above every substance may be used as well.

In the embodiment, as for the second gate insulating layer 324, the silicon oxynitride thin film can be used, and a thin film formed of another inorganic insulating material possessing the same or similar material characteristics as the above substance may be used as well.

In the embodiment, as for the third gate insulating layer 325, the silicon oxide thin film, the aluminum oxide thin film or the titanium oxide thin film can be used, and a thin film formed of another inorganic insulating material possessing the same or similar material characteristics as the above every substance may be used as well.

In the embodiment, the first gate insulating layer includes the silicon oxide, silicon oxynitride thin film, or the like. Because the material can suppress the poor characteristics produced with contacting with the gate metal (especially when Cu and a Cu alloy is used for the gate) despite that its direct contact with the oxide semiconductor will cause properties of the oxide semiconductor layer to degrade, the first gate insulating layer is disposed to adjoin the gate and far away from the active layer. The second gate insulating layer is disposed as a middle layer. Because the second gate insulating layer made of the silicon oxynitride thin film or the like contains fewer groups such as H+, OH— and so on by itself and has certain penetration resistance with respect to the groups such as H+, OH— and so on, the diffusion of the groups such as H+, OH— and so on toward the oxide semiconductor layer can be suppressed nicely, which enhances stability of the device. Meanwhile, in order to enhance characteristics of the device to the most extent, the third gate insulating layer is disposed to adjoin the oxide semiconductor, and better match with the oxide semiconductor can be obtained, which enhances stability of the device.

In the embodiment, when the thickness of the first gate insulating layer 323 is, e.g., 50 nm~600 nm, it is possible that the poor characteristics produced upon the gate insulating layer contacting with the gate (especially when Cu and a Cu alloy is used for the gate) can be better suppressed (if the first gate insulating layer 323 is too thin, this function can not be achieved), and not too much tact time will be sacrificed (if the first gate insulating layer is too thick, a longer tact time period is needed, which causes reduction of the production efficiency).

More preferably, the thickness of the first gate insulating layer 323 is for example 100 nm~200 nm, and in this case, the relationship between the poor contact between the gate insulating layer and the gate and a suitable tact time period can be better balanced.

When the thickness of the second gate insulating layer 324 is for example 50 nm~650 nm, it is possible that diffusion of the groups such as H+, OH— and so on toward the oxide semiconductor layer is greatly suppressed, so as to achieve an object of enhancing stability of the device; and moreover, it is unnecessary to consume too much tact time (if the film layer is thicker, a longer tact time period is needed, and the production efficiency is adversely affected).

More preferably, the thickness of the second gate insulating layer 324 is, e.g., 100 nm~200 nm. With this preferable thickness, it is possible that diffusion of the groups such as H+, OH— and so on toward the oxide semiconductor layer is better suppressed, and tact time is relatively most saved to thereby enhance the production efficiency.

When the thickness of the third gate insulating layer 325 is, e.g., 20 nm~600 nm, it is possible that better match for the third gate insulating layer 325 with the oxide semiconductor is obtained so as to achieve a function of enhancing stability of the device; and moreover, it is unnecessary to consume too much tact time (if the film layer is thicker, a longer tact time period is needed, and the production efficiency is adversely affected).

More preferably, the thickness of the third gate insulating layer 325 is, e.g., 100 nm~150 nm. In this case, it is possible that least tact time (specifically the time for manufacturing the third gate insulating layer) is used to complete manufacture of the device, if better match for the third gate insulating layer 325 with the oxide semiconductor is obtained.

It should be noted that, what is shown in FIG. 7 is a part of an array substrate comprising the thin film transistor according to the embodiment, and the thin film transistor provided by the embodiment is in the portion on the left side of FIG. 7. A common electrode line 322b of the array substrate is formed with the same metal layer as the gate 322a simultaneously. When the thin film transistor according to the embodiment is used to manufacture an array substrate, the common electrode line may not be formed as well, or may be formed but not with the same metal layer as the gate simultaneously.

A source and a drain of the thin film transistor according to the embodiment are not shown in FIG. 7, but they should be formed over the active layer 326a, spaced from each other by a distance and opposite to each other, and a part of the active layer 326a located between the source and the drain constitutes a channel. The oxide semiconductor of the active layer 326a may comprise indium gallium zinc oxide (IGZO), indium gallium tin oxide (IGTO), indium zinc oxide (IZO) and so on, and compositions of different proportions of the materials.

According to the embodiment, there is further provided a method for manufacturing the thin film transistor of the embodiment. As shown in FIG. 9, the method comprises the following steps.

Step S501: a gate layer is formed on a substrate.

For example, the gate layer is formed on a glass substrate which is an example of the base substrate, and the gate layer is usually produced by means of magnetron sputtering. The conductive material for the electrode may be copper or an alloy thereof, the thickness is generally 200 nm-350 nm, and the sheet resistance of it is made to keep at a relatively low level.

Step S502: the gate layer is patterned.

For example, by means of wet etching, the gate layer is patterned to form a gate.

Step S503: a silicon nitride thin film or a silicon oxynitride thin film is used to form a first gate insulating layer on the gate.

The thickness of the first gate insulating layer is for example 50 nm~300 nm.

When the thickness of the first gate insulating layer 323 is 50 nm~600 nm, it is possible that the poor characteristics produced upon the gate insulating layer contacting with the gate (especially when Cu and a Cu alloy is used for the gate) is better suppressed, and not too much tact time will be sacrificed.

More preferably, the thickness of the first gate insulating layer 323 is for example 100 nm~200 nm, and in this case, it is possible that the relationship between the poor contact between the gate insulating layer and the gate and a suitable tact time period can be better balanced.

Step S504: a silicon oxynitride thin film is used to form a second gate insulating layer on the first gate insulating layer.

When the thickness of the second gate insulating layer 324 is for example 50 nm~650 nm, it is possible that diffusion of groups such as H+, OH— and so on toward the oxide semiconductor layer is greatly suppressed, so as to achieve an object of enhancing stability of the device; and moreover, it is unnecessary to consume too much tact time (if the film layer is thicker, a longer tact time period is needed, and the production efficiency is adversely affected).

More preferably, the thickness of the second gate insulating layer 324 is, e.g., 100 nm~200 nm. With this preferable thickness, it is possible that diffusion of the groups such as H+, OH— and so on toward the oxide semiconductor layer is better suppressed, and tact time is relatively most saved to thereby enhance the production efficiency.

Step S505: silicon oxide, aluminum oxide or titanium oxide is used to form a third gate insulating layer on the second gate insulating layer.

When the thickness of the third gate insulating layer 325 is, e.g., 20 nm~600 nm, it is possible that better match with the oxide semiconductor is obtained for the third gate insulating layer 325 so as to achieve a function of enhancing stability of the device; and moreover, it is unnecessary to consume too much tact time (if the film layer is thicker, a longer tact time period is needed, and the production efficiency is affected).

More preferably, the thickness of the third gate insulating layer 325 is, e.g., 100 nm~150 nm. In this case, it is possible that least tact time (it specifically refers to a time for manufacturing the third gate insulating layer) is used to complete manufacture of the device, if better match with the oxide semiconductor is obtained for the third gate insulating layer 325.

Step S506: an oxide semiconductor for an active layer is formed on the third gate insulating layer and then patterned.

It can be appreciated by those skilled in the art that, the method for manufacturing the thin film transistor of the embodiment may be implemented in other manners. For example, after formation of the gate by patterning, a thin film for the gate insulating layer and a thin film for the active layer are sequentially formed, and then a patterning process is carried out to form the gate insulating layer and the active layer correspondingly.

In the embodiment, the first gate insulating layer employs the silicon nitride or silicon oxynitride thin film. Because the material can better suppress the poor characteristics produced by the contact with copper or an alloy thereof despite that its direct contact with the oxide semiconductor layer will cause properties of the oxide semiconductor layer to degrade, the first gate insulating layer is disposed to adjoin the gate and far away from the active layer. The second gate insulating layer is disposed as a middle layer. Because the second gate insulating layer made of the silicon oxynitride thin film or other oxynitride insulating layer contains fewer groups such as H+, OH— and so on by itself, and has certain penetration resistance with respect to the groups such as H+, OH— and so on, diffusion of the groups such as H+, OH— and so on toward the oxide semiconductor layer can be suppressed nicely, to thereby achieve an object of enhancing stability of the device. Moreover, in order to enhance characteristics of the device to the better extent, the match with the oxide semiconductor can be better obtained by means of making the third gate insulating layer adjoin the oxide semiconductor, to thereby achieve a function of enhancing stability of the device.

Sixth Embodiment

The difference between the embodiment and the fifth embodiment lies in that: the thin film transistor provided by the embodiment is a thin film transistor with a gate layer on the top layer (i.e., a top-gate type). The thin film transistor comprises: an active layer located on a base substrate, a gate insulating layer provided on the active layer, and a gate provided on the gate insulating layer. The structure and manufacturing method of the gate insulating layer are the same as the structure and manufacturing method of the gate insulating layer in the fifth embodiment in terms of details thereof. However, because the first gate insulating layer is located next to the gate and the third gate insulating layer is located next to the active layer, it is necessary that the third gate insulating layer be formed first, next the second gate insulating layer be formed, then the first gate insulating layer be formed on the second gate insulating layer, and subsequently, the gate layer is formed on the second gate insulating layer, if the active layer is at the bottom layer. The process method for forming each structural layer is the same as that of the fifth embodiment in detail, and is not repeated here.

It should be noted that, regarding the first gate insulating layer, the first gate insulating layer and the third gate insulating layer included in the foregoing gate insulating layer, "first", "second" and "third" do not exactly refer to the first layer, the second layer and the third layer of the gate insulating layer, but are merely used to distinguish individual layers in the gate insulating layer from each other.

It should be further noted that, in the above embodiments of the invention, besides Cu and alloy thereof, Mo, Mo—Al—Mo alloy, stack structure of Mo/Al—Nd/Mo for electrodes, pure Al and alloy thereof, Mo/Nd/Cu, Ti/Cu or other metals can be used as metals for the gate.

The thin film transistor according to any embodiment of the invention not only comprises the gate, the gate insulating layer and the active layer, but also comprises a source, a drain, an etch stop layer and other constituent components of the thin film transistor. These components can be implemented by any suitable conventional means, so the source, the drain, the etch stop layer and other components are not described in detail.

In four embodiments, including the third embodiment, the fourth embodiment, the fifth embodiment and the sixth embodiment, according to the invention, when the gate employs copper or copper alloy, effects such as optimizing the patterning process, enhancing properties of the device and reducing the cost can be obtained; and the oxide semiconductor can be used for the active layer to make the device have a higher response speed, a lower power assumption and a lower cost, as compared with the case where amorphous silicon is used for the active layer. With the structure and manufacture method of the gate insulating layer in any of these embodiments, better contact and match between the gate and the active layer can be realized simultaneously, and the adverse effect on the active layer (the oxide semiconductor) given by the hydrogen-containing groups can be effectively avoided. Thus, it is possible that yield of the product is increased, and stability of the whole TFT device is enhanced to the most extent, which brings a wide application prospect.

Seventh Embodiment

The seventh embodiment of the invention also provides an array substrate, comprising the thin film transistor in any of the foregoing embodiments. The thin film transistor can be used to fabricate a switching element of a pixel unit, and gate insulation layers of different layer(s) can be produced by different manufacturing methods in the foregoing embodiments. Hereinafter, a method for manufacturing the array substrate will be described only based on the example in which a gate insulation layer has a three-layered structure. An example of the array substrate is in a bottom-gate structure.

Figure 10:
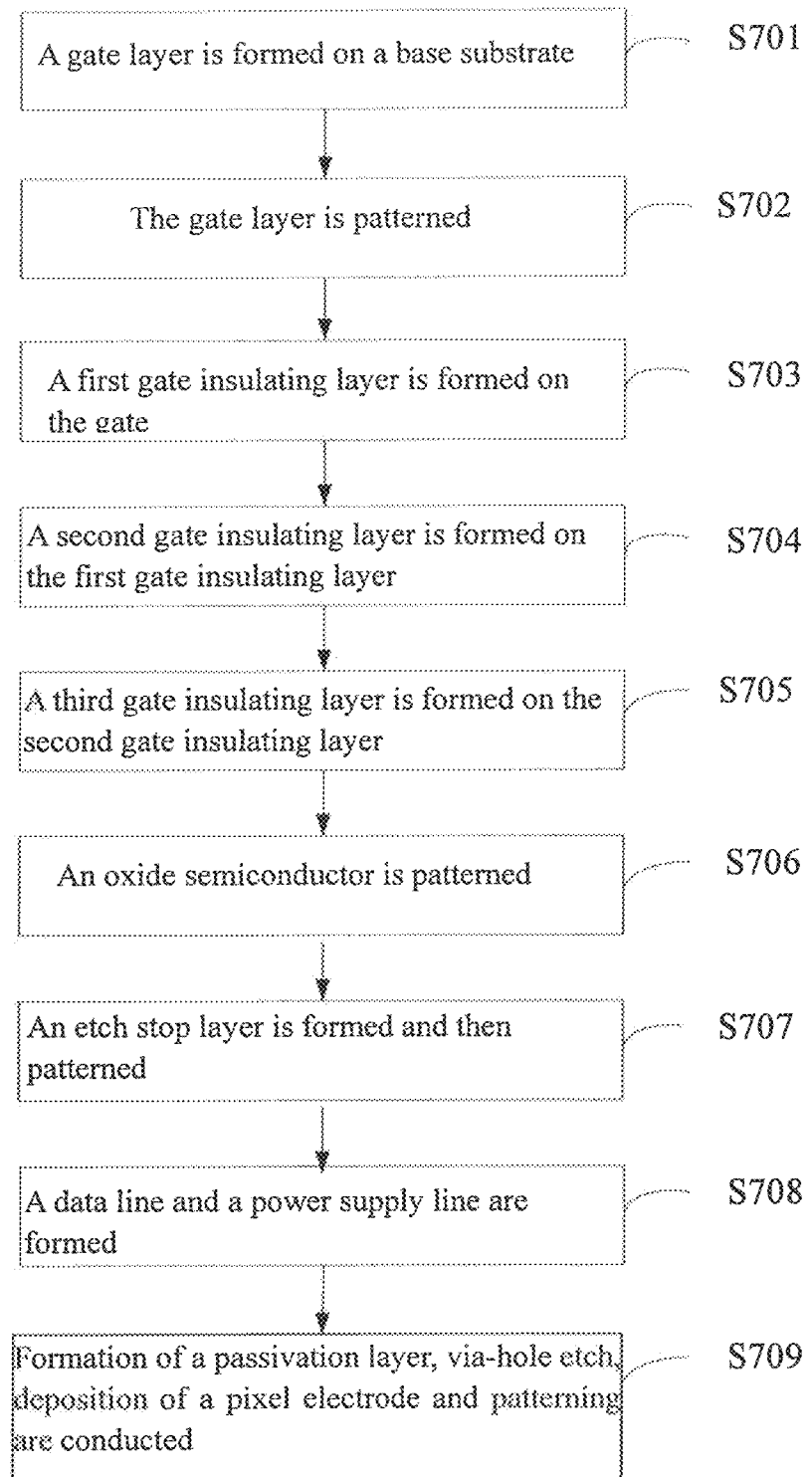
FIG. 10 is a flow chart showing a method for manufacturing the array substrate according to the seventh embodiment of the invention.

As shown in FIG. 10, the method for manufacturing the array substrate can comprise the following steps.

Step S701: a gate layer is formed on a base substrate.

Figure 9A:
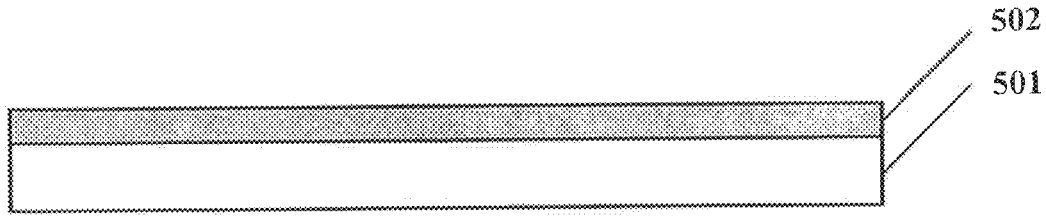
FIGS. 9A to 9J are the first to tenth schematic views showing the manufacture of an array substrate according to a seventh embodiment of the invention.

As shown in FIG. 9A, a gate layer 502 is formed on a glass substrate 501 which is an example of the base substrate. During manufacture of the TFT, the gate layer is produced by means of magnetron sputtering in most cases, and the conductive material for the electrode can be selected depending on different device structures and process requirements. Metals, which are generally employed for the gate, include Mo, Mo—Al—Mo alloy, stack structure of Mo/Al—Nd/Mo for electrodes, pure Al and alloy thereof, Cu and alloy thereof, Mo/Nd/Cu, Ti/Cu and other metals, and typically have a thickness of 200 nm-350 nm and a sheet resistance kept at a relatively low level.

Step S702: the gate layer is patterned.

Figure 9B:
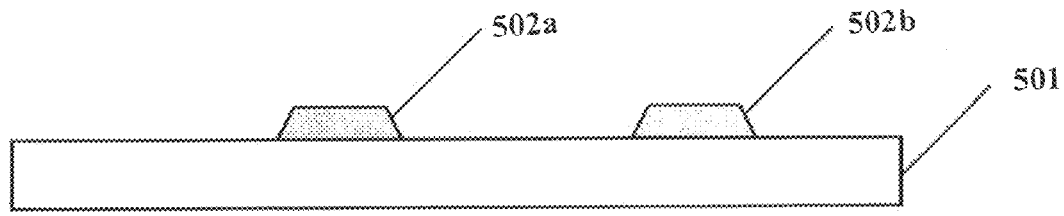
Figure 9C:
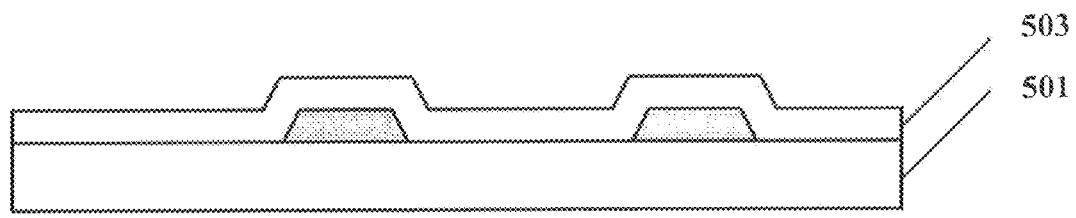
Figure 9D:
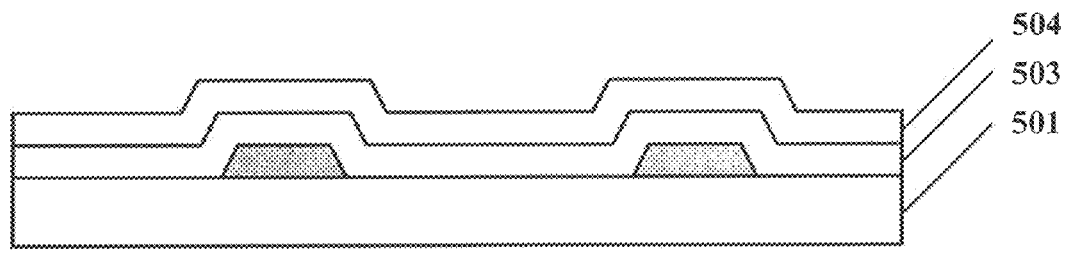
Figure 9E:
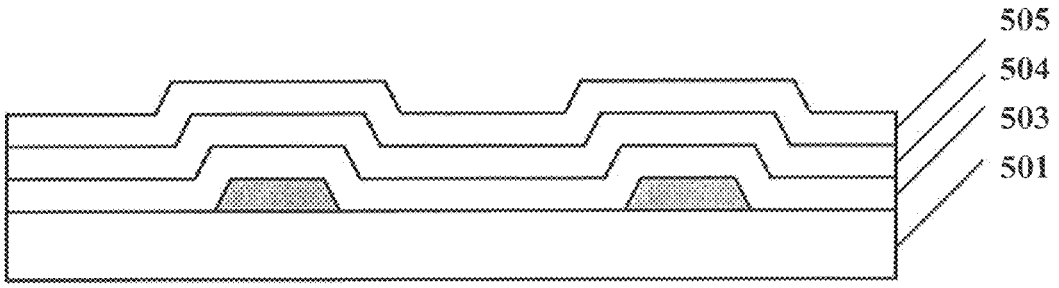

As shown in FIG. 9B, by means of wet etching, the gate layer 502 is patterned, so as to form a gate 502a and a common electrode line 502b.

Step S703: a silicon nitride thin film or a silicon oxynitride thin film is used to form a first gate insulating layer 503 on the gate, and the thickness of the first gate insulating layer 503 is, e.g., 50 nm-300 nm. Please refer to FIG. 9C.

Step S704: a silicon oxynitride thin film is used to form a second gate insulating layer 504 on the first gate insulating layer 503. Please refer to FIG. 9D.

Step S705: silicon oxide, aluminum oxide or titanium oxide is used to form a third gate insulating layer 505 on the second gate insulating layer 504. Please refer to FIG. 9E.

Step S706: an oxide semiconductor for an active layer is formed on the third gate insulating layer 505, and patterned.

Figure 9F:
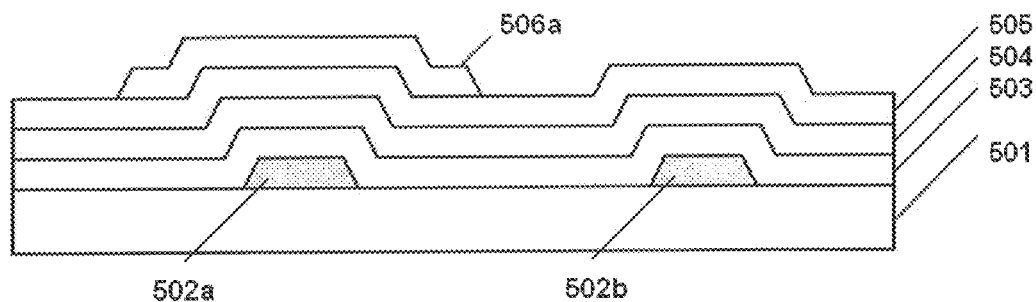
Figure 9G:
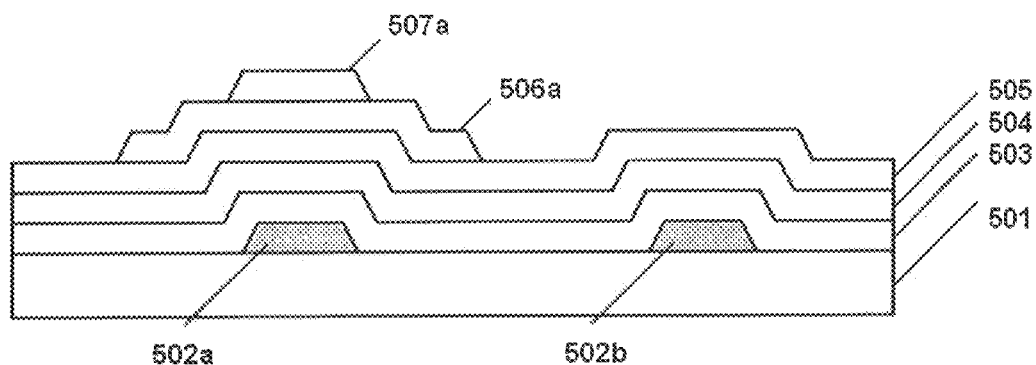

Accordingly, a patterned active layer 506a is obtained, as shown in FIG. 9F. An oxide semiconductor layer is formed for the active layer, and the oxide semiconductor may be indium gallium zinc oxide (IGZO), indium tin zinc oxide (ITZO), indium zinc oxide (IZO) and so on, or compositions of different proportions of these substances. The main manufacturing methods include a magnetron sputtering deposition, a solution method, and etc. For the etch method of the oxide semiconductor for the active layer, there are two kind of methods: a wet etching and a dry etching. For example, etching accuracy can be controlled well by the wet etching. The oxide semiconductor layer is patterned by means of etching.

Step S707: an etch stop layer is formed and then patterned.

An etch stop layer (ESL) 507a is directly formed on the patterned oxide semiconductor layer 506a. Generally, it is necessary that an inorganic insulating material, such as SiOx, SiNx, SiOxNy, Al2O3, TiOx, Y2O3, or the like, be used as the material for the etch stop layer 507a so as to reduce damages to the oxide semiconductor thin film during patterning of a data line. Moreover, stability of the device can be effectively improved so as to avoid the device from being affected by the surrounding environment. The ESL is patterned usually by means of dry etching, as indicated by 507a in FIG. 9G.

Step S708: a source and a drain of the thin film transistor, a data line, and a power supply line are formed.

Figure 9H:
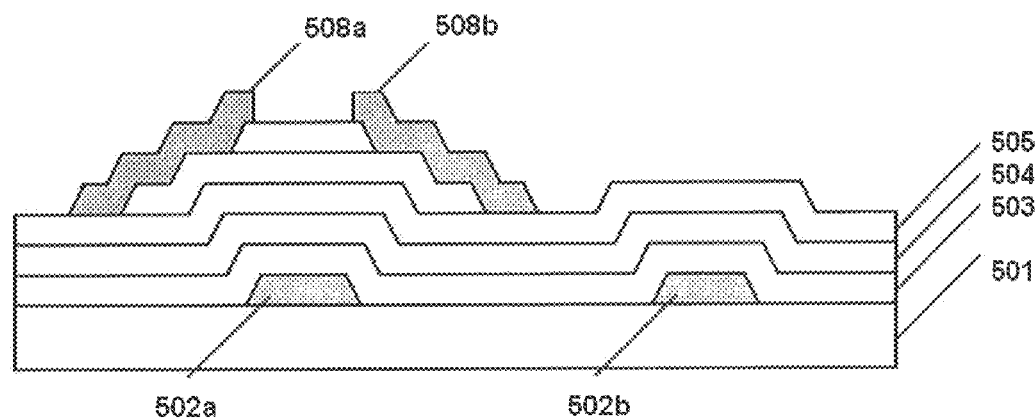

As shown in FIG. 9H, after the manufacturing processes of steps S706 and S707, a source 508a, a drain 508b, a data line, and a power supply line (applied to an OLED display panel and not shown here) are formed. Firstly, a metal layer 508 is deposited, so as to form an electrode layer for the data line and power supply line. The metal layer is produced by means of magnetron sputtering in most cases. Material for the electrodes can be selected according to different device structures and process requirements. Examples of metals for the electrodes comprise Mo, Mo—Al—Mo alloy, stack structure of Mo/Al—Nd/Mo for electrodes, Cu and metal titanium and alloys thereof, ITO, Ti/Al/Ti, Mo/ITO or etc., and have a thickness of such as 100 nm-350 nm and a sheet resistance kept at a relatively low level. After formation of the metal electrode layer, a patterning process is performed on the layer. The patterning is performed on the layer by using a wet etching method.

Step S709: formation of a passivation layer, via-hole etch, deposition of a pixel electrode and patterning are conducted.

Figure 9I:
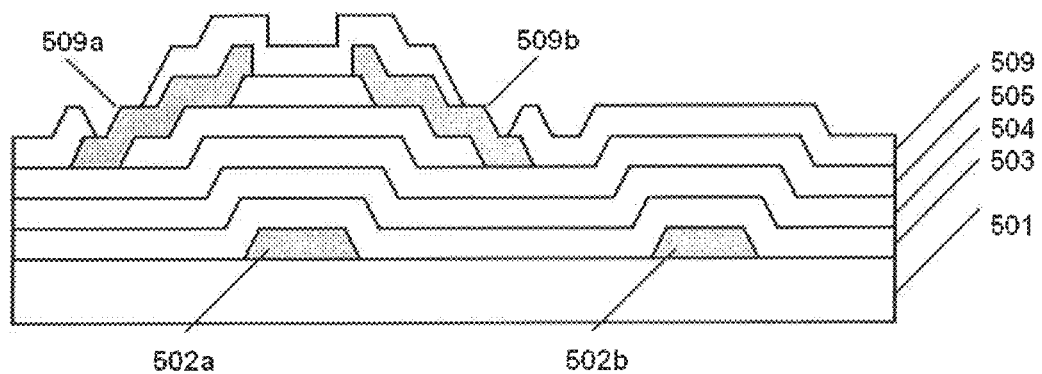
Figure 9J:
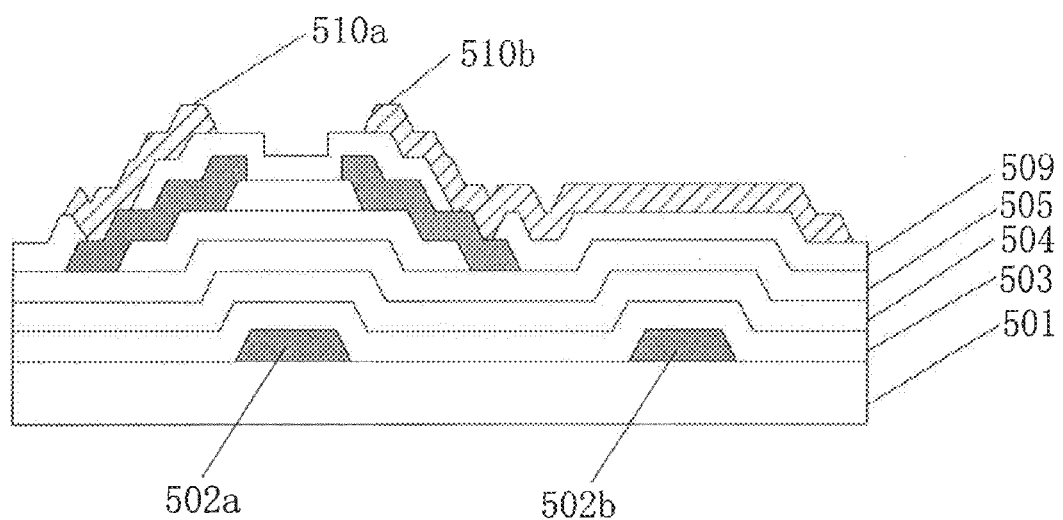

As shown in FIG. 9I, after patterning of the source, the drain, and the data line and the power supply line, a passivation layer 509 is formed on the entire plane, and an inorganic insulating material, such as SiOx, SiNx, SiOxNy, Al2O3, TiOx, Y2O3 and etc., may usually be used. For example, for an active matrix organic light-emitting display (AMOLED) field, an organic insulating layer, such as a resin material or an acrylic material, may be used also so as to make the subsequent manufacturing conditions of OLED more appropriate. An etch process for via-holes is carried out after formation of the passivation layer to obtain via holes 509a and 509b, so as to achieve each wiring and the connection to a pixel electrode, as shown in FIG. 9I. After the foregoing processes are completed, deposition and patterning of the pixel electrode are carried out. As shown in FIG. 9J, after formation of the via holes, a pixel electrode layer 510, the widely employed material for which includes a indium tin oxide (ITO) at present, is formed, and patterned by means of wet etching, so as to obtain a contact electrode 510a and a pixel electrode 510b as shown in FIG. 9J.

Regarding the above method for manufacturing the array substrate, except for the method for manufacturing the gate insulating layer, every other structural layer can be obtained by a process method commonly used.

The various array substrates and manufacturing methods thereof according to embodiments of the invention may be applied to the array substrates for liquid crystal displays, such as TN type array substrates, FFS type array substrates, IPS array substrates or VA type array substrates, and also the array substrates for OLED displays.

Furthermore, according to an embodiment of the invention, there is further provided a display device, comprising any of the foregoing array substrate. The display device comprises but is not limited to a liquid crystal panel, an OLED panel, a liquid crystal display, a liquid crystal television, a liquid crystal screen, a tablet computer and other electronic display apparatus.

In the embodiments of the invention, by means of applying an annealing process, or a layered structure in combination with the annealing process, or the layered structure to the gate insulating layer in the thin film transistor, the hydrogen-containing groups within the gate insulating layer can be decreased to the most extent, and an adverse effect on the oxide semiconductor given by the hydrogen-containing groups can be effectively avoided, so as to enhance stability of the whole TFT device to the most extent and increase yield of final products. Further, the annealing process employed by the embodiments of the invention is an optimized annealing process, and as compared with a conventional annealing process, it is possible that the process time for manufacturing the device is greatly shortened, the production cost for equipments in the production line is effectively reduced, and throughput and yield of the product are further increased.

With respect to embodiments of the invention, many modifications and variations are obvious to those artisans with ordinary skills in the art. The protection scope of the present invention is defined by attached claims.

What is claimed is:

1. A method for manufacturing the thin film transistor, comprising:

sequentially forming an active layer, a gate insulating layer and a gate on a base substrate;
wherein the active layer is an oxide semiconductor, and the gate insulating layer is in a double-layer structure comprising a first gate insulating layer next to the gate and a second gate insulating layer next to the active layer, and
wherein forming of the gate insulating layer comprises:
forming the second gate insulating layer without annealing on the active layer;
forming the first gate insulating layer on the second gate insulating layer; and
performing an annealing process on the first gate insulating layer; and
the annealing process comprises:
the first gate insulating layer being dehydrogenized with a high temperature annealing furnace,
the annealing process being carried out under the protection of nitrogen gas, vacuum, or rare gas, in which annealing temperature is 250° C.~450° C. and annealing time is 20 min~150 min.

2. The method for manufacturing the thin film transistor according to claim 1, wherein at least one of the first gate insulating layer and the second gate insulating layer is an inorganic insulating thin film.

3. The method for manufacturing the thin film transistor according to claim 2, wherein the first gate insulating layer is formed of silicon nitride or silicon oxynitride.

4. The method for manufacturing the thin film transistor according to claim 3, wherein the second gate insulating layer is formed of silicon oxide, yttrium oxide, or silicon oxynitride.

5. The method for manufacturing the thin film transistor according to claim 1, wherein the first gate insulating layer has a thickness of 50 nm~600 nm.

6. The method for manufacturing the thin film transistor according to claim 5, wherein the first gate insulating layer has a thickness of 100 nm~300 nm.

7. The method for manufacturing the thin film transistor according to claim 1, wherein the second gate insulating layer has a thickness of 50 nm~650 nm.

8. The method for manufacturing the thin film transistor according to claim 7, wherein the second gate insulating layer has a thickness of 100 nm~200 nm.

9. A method for manufacturing the thin film transistor, comprising:
sequentially forming an active layer, a gate insulating layer and a gate on a base substrate;
wherein the active layer is an oxide semiconductor, and the gate insulating layer is in a double-layer structure comprising a first gate insulating layer next to the gate and a second gate insulating layer next to the active layer, and
wherein forming of the gate insulating layer comprises:
forming the second gate insulating layer without annealing on the active layer;
forming the first gate insulating layer on the second gate insulating layer; and
performing an annealing process on the first gate insulating layer, and
wherein the annealing process comprises:
within a vacuum heating chamber being incorporated into a plasma enhanced chemical vapor deposition (PECVD) apparatus for sequentially forming the active layer, the gate insulating layer and the gate, in which the pressure is $10^{-4}$ Pa~1 Pa,
a dehydrogenizing process being performed on the first gate insulating layer, in which the temperature of the vacuum heating chamber is 350° C.~480° C., and an annealing time period is 10 min~30 min.

* * * * *